US011873565B2

(12) United States Patent
Järvinen et al.

(10) Patent No.: US 11,873,565 B2
(45) Date of Patent: Jan. 16, 2024

(54) ENERGY MANAGEMENT METHOD AND ARRANGEMENT

(71) Applicant: Tercosys Oy, Jyväskylä (FI)

(72) Inventors: Ari Järvinen, Jyväskylä (FI); Harri Sopo, Jyväskylä (FI)

(73) Assignee: Tercosys Oy, Jyväskylä (FI)

( * ) Notice: Subject to any disclaimer, the term of this patent is extended or adjusted under 35 U.S.C. 154(b) by 84 days.

(21) Appl. No.: 17/275,147

(22) PCT Filed: Sep. 6, 2019

(86) PCT No.: PCT/FI2019/050639
§ 371 (c)(1),
(2) Date: Mar. 10, 2021

(87) PCT Pub. No.: WO2020/053478
PCT Pub. Date: Mar. 19, 2020

(65) Prior Publication Data
US 2022/0042181 A1    Feb. 10, 2022

(30) Foreign Application Priority Data
Sep. 11, 2018    (FI) ...................................... 20187132

(51) Int. Cl.
*C25B 1/26* (2006.01)
*F24V 30/00* (2018.01)
(Continued)

(52) U.S. Cl.
CPC ................... *C25B 1/26* (2013.01); *C25C 3/02* (2013.01); *C25C 7/06* (2013.01); *F24V 30/00* (2018.05);
(Continued)

(58) Field of Classification Search
CPC .................................... C25B 1/46; C25C 3/02
(Continued)

(56) References Cited

U.S. PATENT DOCUMENTS 6,329,098 B1 * 12/2001 Bliesner .................... C25C 3/02
429/103
6,516,871 B1 * 2/2003 Brown .................. F28D 19/044
165/8
(Continued)

FOREIGN PATENT DOCUMENTS

| CN | 106953352 A * | 7/2017 | .......... H01M 10/399 |
| EP | 3033443 B1 | 3/2018 | |
| WO | WO2015058165 A1 | 4/2015 | |

OTHER PUBLICATIONS

Ramakumar et al, Development and Adaptation of Field Modulated Generator Systems for Wind Energy Applications, Aug. 1976, pp. 1-420, available online at http://osti.gov/servelts/purl/7287303 (Year: 1976).*

(Continued)

*Primary Examiner* — Harry D Wilkins, III
(74) *Attorney, Agent, or Firm* — Katterle Nupp LLC; Paul Katterle; Robert Nupp

(57) ABSTRACT

There is provided an energy management method, comprising steps of conducting (304) electric energy from an energy production plant (110, 112, 114, 140) to an energy storage facility (120, 220), applying, in the energy storage facility (120, 220), the received electric energy on a chemical compound (222) to separate the chemical compound to a first component (224) and a second component (226), and storing (306), in the energy storage facility (120, 220), the first component and the second component separately.

16 Claims, 4 Drawing Sheets

(51) Int. Cl.
*C25C 3/02* (2006.01)
*H02J 3/28* (2006.01)
*H10N 10/13* (2023.01)
*C25C 7/06* (2006.01)
*H02J 15/00* (2006.01)

(52) U.S. Cl.
CPC ............... *H02J 3/28* (2013.01); *H02J 15/00* (2013.01); *H10N 10/13* (2023.02)

(58) Field of Classification Search
USPC ......................................................... 122/21
See application file for complete search history.

(56) References Cited

U.S. PATENT DOCUMENTS

| | | | | |
|---|---|---|---|---|
| 2011/0100328 A1* | 5/2011 | Paul | ...................... | H01M 8/186 174/138 R |
| 2012/0122017 A1* | 5/2012 | Mills | ........................ | G21B 3/00 429/218.2 |
| 2012/0301801 A1 | 11/2012 | Wein | | |
| 2015/0263523 A1 | 9/2015 | Goldman | | |
| 2016/0013749 A1* | 1/2016 | Tarabishi | ................ | H02S 40/44 60/641.14 |
| 2021/0164696 A1* | 6/2021 | Flesch | ................... | F28D 20/003 |

OTHER PUBLICATIONS

Machine translation of Zhang CN 106953352 A (Year: 2017).*
Wenger et al, Thermo-electro-chemical storage (TECS) of solar energy, Applied Energy, vol. 190, Mar. 2017, pp. 788-799 (Year: 2017).*
International Search Report for corresponding PCT/FI2019/050639.
Written Opinion of the International Searching Authority for PCT/FI2019/050639.
Popel Os et al, "Modern Kinds of Electric Energy Storages and their Application in Independent and Centralized Power Systems", Thermal Engineering, 2011, vol. 58, No. 11, pp. 883-893.
Supplementary European Search Report for EP19860383, transmitted Nov. 14, 2022.

* cited by examiner

ENERGY MANAGEMENT METHOD AND ARRANGEMENT

CROSS-REFERENCE TO RELATED APPLICATIONS

This application is the U.S. national phase of PCT Application No. PCT/FI2019/050639 filed on 6 Sep. 2019, which claims priority to Finnish Patent Application No.: 20187132 filed on 11 Sep. 2018, the disclosures of which are incorporated in their entirety by reference herein.

FIELD

The present invention relates to a method and arrangement for storing and recovering energy.

BACKGROUND

Employment of renewable energy is increasing rapidly in modern power systems. Also there is a continuous need for energy storage solutions as the production of energy does not always match the level of consumption of the consumers.

Several alternative ways have been proposed for storing excess energy, such as by using hydroelectric, compressed air or thermal energy storages or by using flywheels to name a few examples.

However, there still exists a need for a new alternative having high efficiency and low environmental impact.

SUMMARY

The disclosure is directed to an improved solution for energy management including energy storage and/or recovery upon need.

In accordance with the disclosure, an energy management method and arrangement are provided. Electric energy produced by an energy production plant is conducted to an energy storage facility in which the electric energy is applied to a chemical compound to separate the chemical compound into a first component and a second component. The first component includes an alkaline metal and the second component includes a halogen gas. The first and second components are stored separately in the energy storage facility. When needed, the first component and the second component are brought together to re-form the chemical compound and produce energy.

DRAWINGS

The invention and some advantageous embodiments have been illustrated in the accompanying drawings, where FIG. 1 shows a high level architecture of the embodiments;

DESCRIPTION OF SOME EMBODIMENTS

The embodiments relate to energy management. In the embodiments, there is provided an energy management method and energy management system for providing energy to users. Specifically, the embodiments relate to usage of an energy storage, that is, to storing and/or recovering energy to/from the energy storage.

Figure 1:
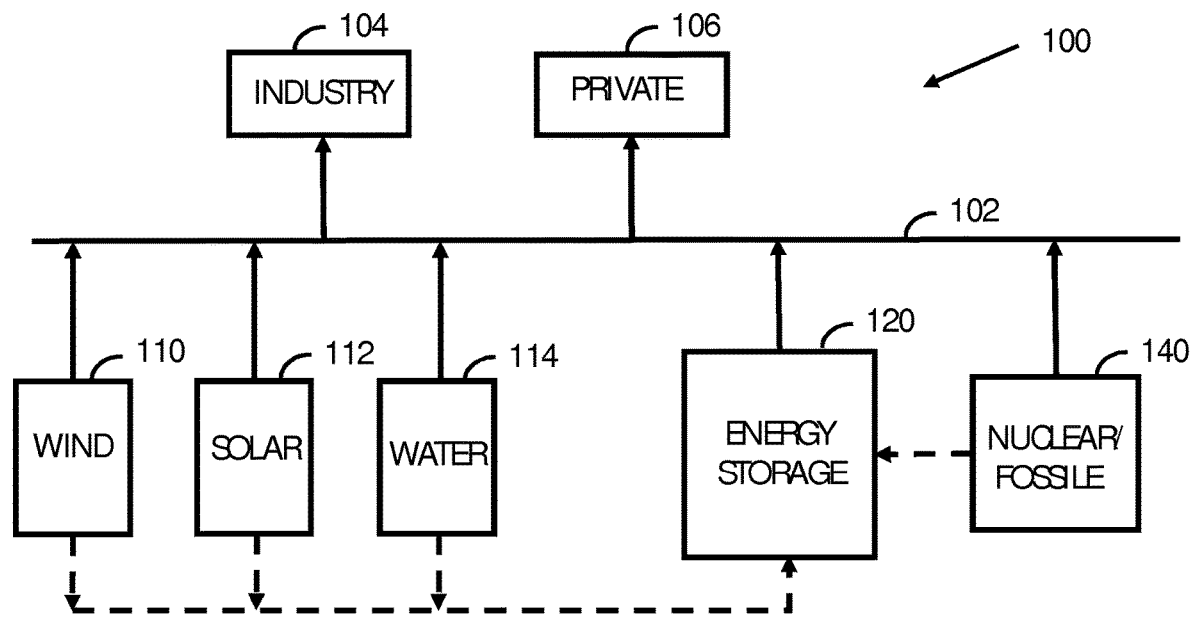

FIG. 1 illustrates the architecture of an energy management system 100 of the invention on a high level.

There is provided a power grid/network 102 for distributing energy produced by the energy provides to the consumers connected to the power network. As one example of the consumers connected to the power network, FIG. 1 shows industrial consumers 104 including factories, other industrial facilities or traffic users, for instance. As another major group of consumers, FIG. 1 shows private users 106 including households, for instance.

To satisfy the energy needs and requirements of the consumers 104, 106, the energy management system comprises energy providers or energy production plants also connected to the power network 102. As examples of the energy providers, FIG. 1 shows a wind farm 110, a solar farm 112 and a hydro energy plant 114. Each of these renewable energy sources 110, 112, 114 can be directly connected to the power network for provision of energy to the network and subsequently to the consumers 104, 106. There may also be a backbone energy provider 140, which may include a nuclear power plant, for instance, for providing most of the energy needed in the grid. Some quick adjustment power provided by a fossile power source, such as coal, may also be connected to the power network 102.

The produced amount of energy from the renewable energy sources cannot be fully predicted beforehand but that depends on environmental weather conditions such as wind, sunshine and rain. If the share of the renewable energy is large in the power network, and the environmental conditions for producing the energy are good, there may be excess energy exceeding the consuming capability of the users connected to the power network. In such situations there is need for capacity of storing energy received from the renewable sources to be used later.

In terms of storing energy, the system comprises an energy storage 120. As shown in FIG. 1, all the renewable energy sources 110, 112 and 114 may be connected to the energy storage. Even the backbone energy source may be connected to the energy storage. For instance, in the case of nuclear energy, adjustment of the energy production is difficult or impossible, whereas such energy not being consumed by the consumers can be advantageously stored in the energy storage facility 120.

The energy storage 120 functions as a further energy source when additional energy is needed to fulfil the needs of the industrial and household users.

Figure 2:
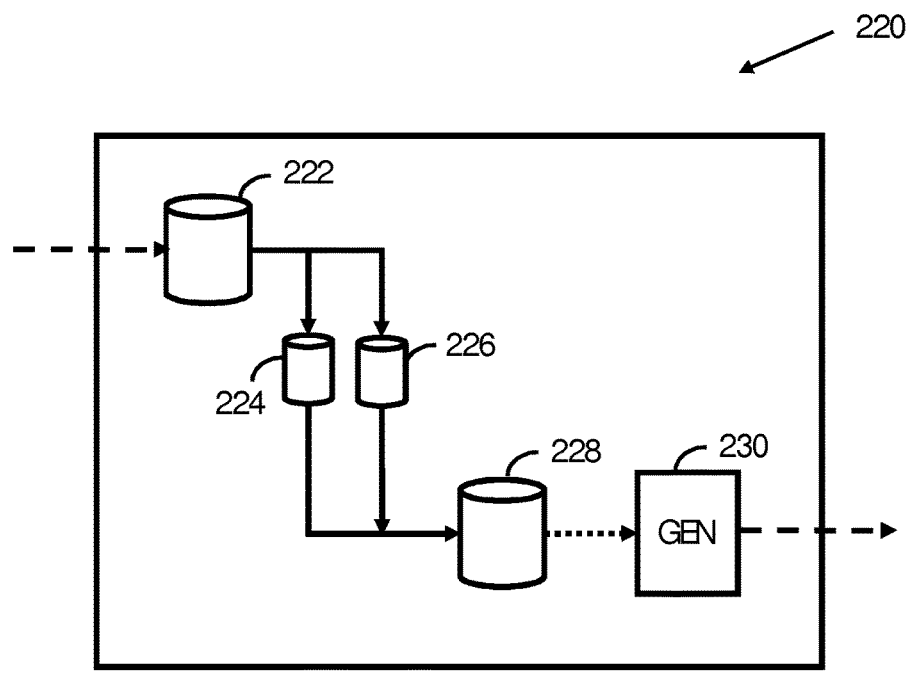
FIG. 2 shows a more detailed view of an energy storage.

FIG. 2 shows a more detailed illustration of the energy storage 220. The energy storage comprises a compound storage 222 for storing a compound. In one embodiment, the compound comprises salt, that is, sodium chloride (NaCl). The dashed line leading to the compound storage 222 denotes energy received from renewable energy sources, for instance. The energy, such as electric energy can be applied in the compound storage in a so called Downs' process where a solid chemical compound is heated to liquid form, and the process is applied to separate components of the compound from each other. Even though reference is made in the following to Downs' process, the embodiments are not limited to use of that process but any corresponding process to separate a chemical compound to components may be applied. Furthermore, the embodiments are not limited to whether the received electric energy is applied directly or indirectly on the compound. Indirect application refers here to conversion of the energy to another form of energy, such as thermal energy.

In the Downs' process there is provided a carbon anode and an iron cathode, where molten sodium chloride is applied as an electrolyte. Melting of sodium chloride needs a temperature approximately 800 Celsius but when melted can be kept liquid at temperature approximately 600 Celsius depending on the composition of the compound. In an embodiment calcium chloride $CaCl_2$) is applied in the compound so that the share by weight of calcium chloride is ⅔ of the mixture and sodium chloride ⅓. In the embodiments of the present invention, the energy received from the energy sources can be used also the heat and melt the electrolyte.

In the Downs' process, as an outcome of the process sodium metal and chlorine gas are obtained as results. Both are less dense than the electrolyte and float to the surface and can be separated into separate storages 224 and 226. The storages 224 and 226 may reside in the proximity of the energy storage, or alternatively they may be remote to the energy storage thereby allowing a very long storage time.

In the inverse process when energy is wished to be recovered from the system, the compound components sodium and chloride are recovered from their respective storages 224, 226 and brought together in the chamber 228. When the sodium and chloride are brought together, sodium chloride is formed and energy is released.

As a result of the chemical process, the energy is output in the form of thermal energy, which may be converted in a generator 230 to electric energy.

Even though above reference has been made to sodium chloride or a mixture containing sodium chloride, also other alkaline metals can be used instead of sodium in combination with chloride or other halogens. Most advantageously the compound is or at least comprises, however, sodium chloride, being a substance being readily available in large quantities thereby providing a cost efficient alternative.

Figure 3:
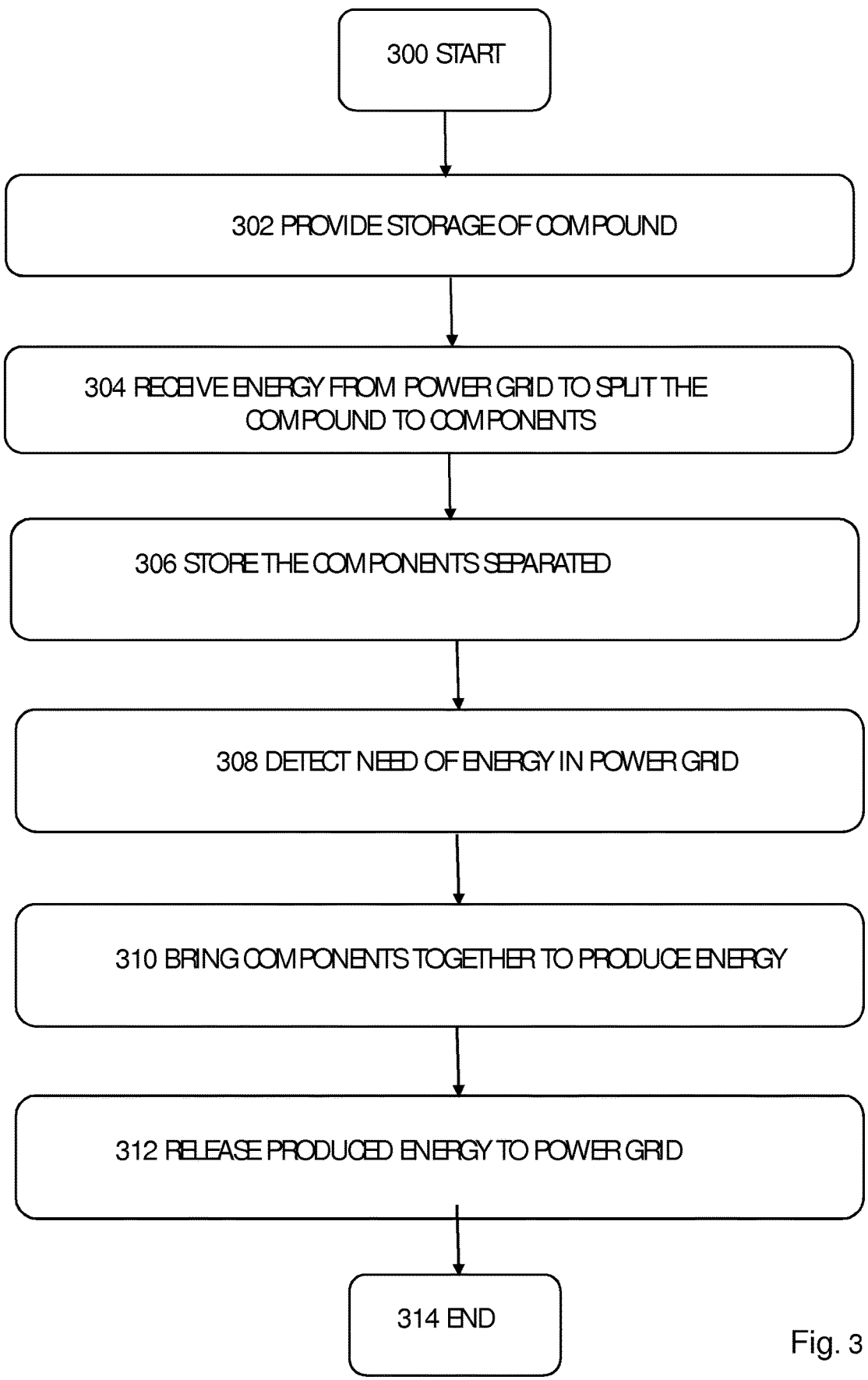
FIG. 3 shows one embodiment of a method.

FIG. 3 illustrates one embodiment of the invention. The embodiment is applicable in a power system, comprising a power network to which consumers of electric energy are connected to. In the embodiment, there are also one or more producers of energy also coupled to the power network. Mainly the embodiment shows the method from the point of view of an operator or service provider of the electric network and the method specifically focuses on how it is possible to balance and optimize usage of electric energy in the network.

In step 302, the service provider has a storage or reservoir of a compound. In a preferred embodiment the compound is or at least comprises salt, that is, sodium chloride. The compound may be arranged into a container or chamber.

In step 304, there may occur a situation when the energy producers are capable of producing more energy than the consumers are consuming for the moment, and/or in the close future. The future consumption may be estimated based on past experience of the consumption as a function of time of the day, and weather conditions, for instance. The situation of over production may take place in a network where a substantial share of the energy production takes place by renewable energy being wind, solar and hydro energy.

Further in step 304, the received energy is utilized to separate the compound to components. In an embodiment, if the compound is salt, the process may be a so called Downs' process for separating the sodium and chloride. In the first stage of the Down process, the compound is heated to a melted status. The energy received from the power network may be applied also for this stage. That is, the electric energy may be led to a resistor associated with the chamber housing the compound to heat it up. When the compound has been melt, the Downs' process can be initiated, and the sodium and chloride obtained can be led to respective containers or chambers according to step 306.

By the method illustrated by steps 302 to 306 significant advantages can be achieved in that the overproduction of electricity can be recovered and stored instead of the network operator being obliged to sell the overproduction for consumers that are prepared to consume or waste the received excess energy.

Steps 308 to 312 show a second phase of the method. In 308, there is detected that the consumption in the power network exceeds the production and energy could be recovered from the energy stored in steps 302 to 306.

In step 310, the sodium and chloride from their respective chambers are brought together in a reaction chamber, whereby salt and thermal energy are produced as the outcome. The thermal energy may then be further processed in the electric plant to produce electric energy. In step 312, the produced electric energy is released to the power network to satisfy the increased need of energy by the consumers.

Figure 4:
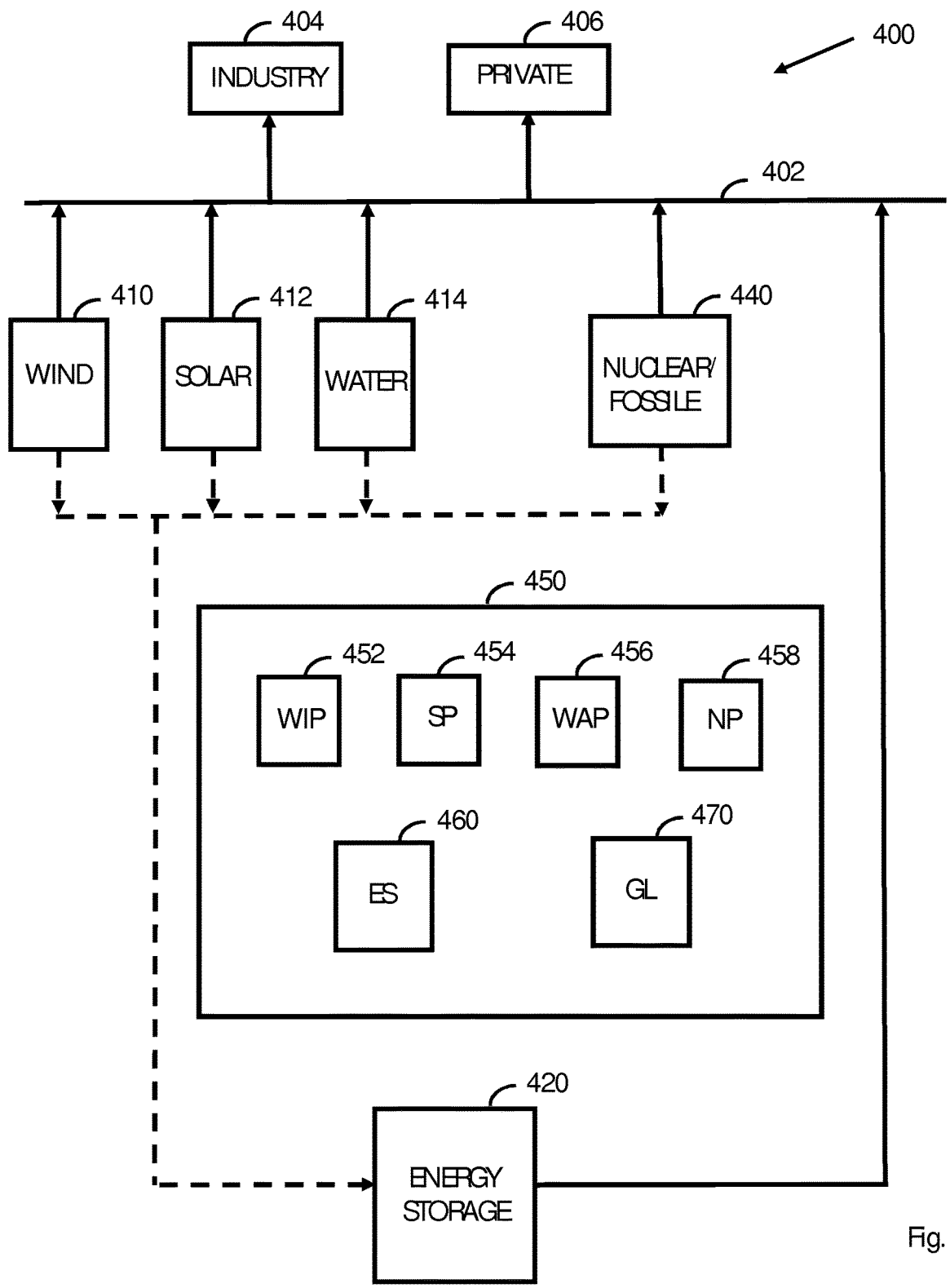
FIG. 4 shows one embodiment of a control system.

FIG. 4 shows an example of the total energy management system according to the invention.

Correspondingly as was shown in connection with FIG. 1, there are provided energy consumers 404, 406 connected to a power grid 402. To the power grid are also connected multiple energy producing plants 410, 412, 414 and 440. The energy producing plants provide mainly energy to the power grid 402 but in circumstances when there is excess energy over the consumption of the consumers, the energy may be conducted to the energy storage 420.

FIG. 4 shows a control system 450 for controlling different operations in the energy management system 400. There may be provided a production level monitoring system 452, 454, 456 and 458 for each of the energy production plant. For example, the monitoring system 452 monitors the current production capacity of the wind power plant 410. The solar monitoring system 454 monitors the actual production of the solar power plant 412, and similarly the monitoring systems 456 and 458 monitor the production of the hydro 414 and nuclear 440 power plants.

The monitoring system 450 may also comprise a grid consumption measuring unit 470 for measuring and/or estimating the grid consumption. The consumption may, for instance, be estimated based on weather prognoses and usual consumption patterns of the users depending on the time of the day, for instance.

The energy storage control unit 460 may control one or more energy storages 420 by monitoring the energy storage capability, for instance. In this controlling it may be monitored how much of the capacity of the energy storage has been used and how much is still available.

In the overall controlling, the controlling unit 450 may perform decisions whether to store energy from one or more energy producing plants to the energy storage or whether to release energy from the energy storage for consumers in the power grid.

Figure 5:
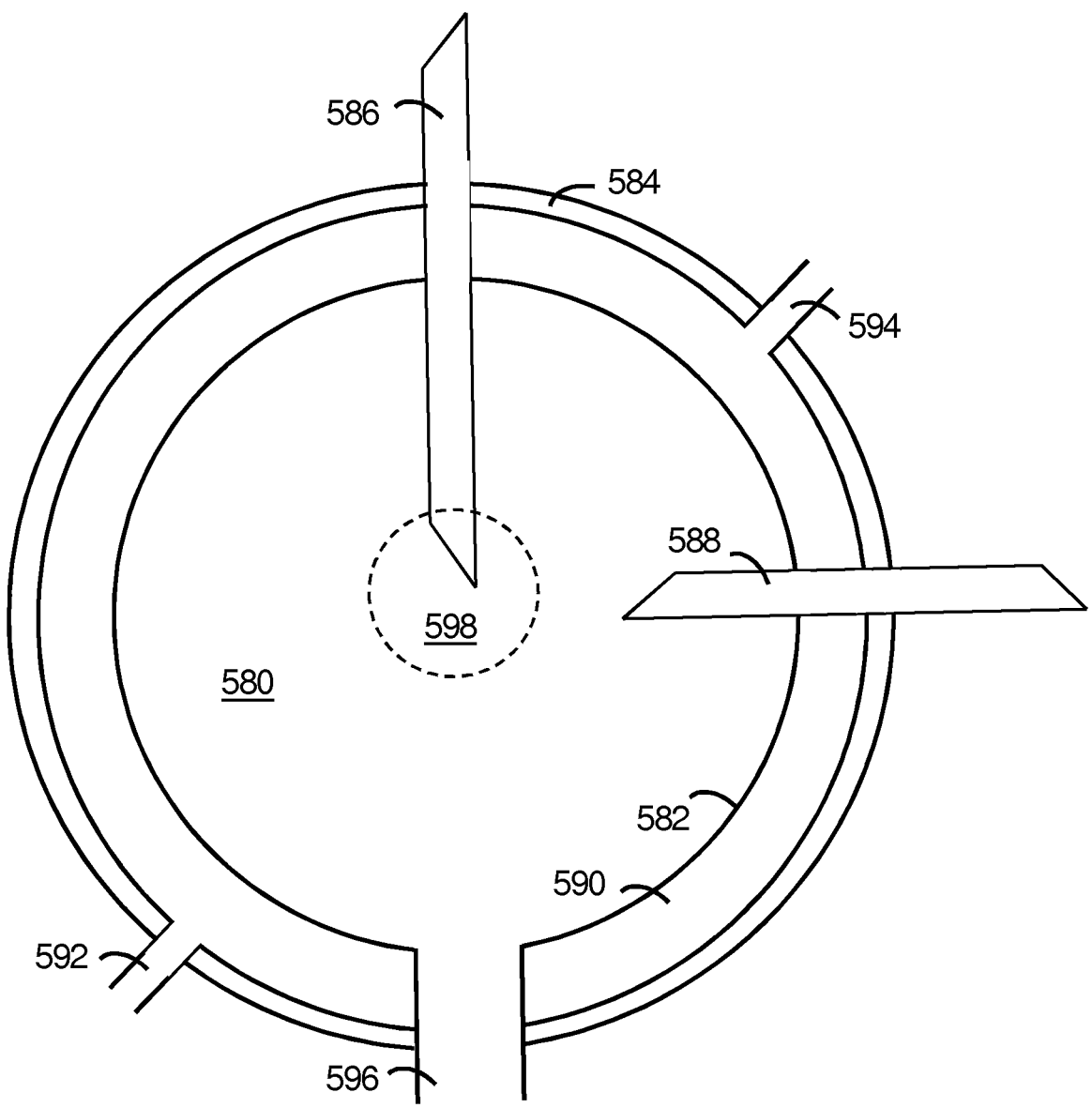
FIG. 5 shows one embodiment of the apparatus applied for combining the substances.

FIG. 5 shows one embodiment of the apparatus or chamber for combining the first and second components and thus recovering energy. Preferably the apparatus may at least substantially have the form of a sphere and FIG. 5 basically shows the cross-section of the sphere.

There is provided an interior space 580, which is applied for combining the first and second components. The first and second components are alkaline metal and halogen gas, respectively, and sodium and chloride are discussed here by way of an example. The chamber comprises a first opening for receiving sodium to the space 580 from the respective container where sodium was stored at the separation phase. To the opening there may be coupled a duct 586 leading to the sodium storage. Preferably sodium is fed to the space 580 as liquid/fluid. The apparatus also comprises a second opening, and the associated duct 588 for conducting chloride into the space 580, and specifically to the area/space 598 where the sodium and chloride react.

Associated with the duct 586 may also be provided with a valve and automatization to prevent the gas flowing to reverse direction in the duct 586. The space 580 is tight and void of other substances, such as oxygen, than the reaction substances being the sodium and chloride in the present example. In the disclosed solution, no exhaust gases such as $CO_2$ develop during the process. There is no burning process and thus no need for an exhaust pipe for the exhaust gases.

In the chemical reaction when sodium and chloride are brought together, sodium-chloride is formed, which can exit the space 580 via the exit opening, and the associated pipe 596 to be reused in a subsequent separation phase. The chemical combining process also produces heat, which is advantageously distributed evenly to the spherical space 580 and the surface 582 of the space is heated at least substantially evenly when having equal distance to the reaction area 598. The surface 582 needs to sustain high temperatures, preferably temperatures being 3500° C. or even higher. The exiting sodium-chloride also contains heat, which may be utilized in the subsequent separation phase of the substance to sodium and chloride. The duration of the storage may vary based on the need, e.g. from 1 minute to 1 year.

On the exterior side of the surface 582 there is provided a sheath 590 for acting as a heat exchanger/mover between the heated space 580 and the exterior of the chamber. The sheath comprises a space for housing fluid, such as air or water or some other flowing substance and can thus be even molten metal. There are also an inlet tube 592 for receiving cooled fluid, and an outlet tube 594 for allowing the heated fluid to exit the sheath/space 590. The inlet tube 592 is preferably arranged to the lower half or the bottom area of the sphere, and the outlet tube 594 is preferably arranged to the upper half or the top area of the sphere to maximize the efficiency of the system.

The surface(s) of the sheath may comprise protrusions and/or cavities for making the surface(s) uneven. In this way the fluid conveyed in the sheath is subject to turbulence and mixing thereby maximizing heat delivery from the space 580 to the exterior of the apparatus via the outlet tube 594.

Further exterior to the sheath 590, there may be provided an insulation layer 584 for preventing undesired heat escaping of the system.

Additionally, there may be provided a safety arrangement in the pipe 586 to prevent gas flowing from the space 580 to reverse direction via the pipe 586.

The heat that has been produced in the energy recovery apparatus, may then applied in generation of electricity. In one embodiment, the energy is recovered by applying thermoelectric energy generation where thermal energy is converted to electrical energy by utilizing a so called Seebek effect in a device called thermoelectric generator (TEG). When applying the thermoelectric energy generation, in one embodiment the heat generation and electricity generation may occur in a single apparatus such that the apparatus directly provides electricity as output. In another embodiment, the thermal energy may be used to rotate a generator in order to create electricity, or alternatively the heat may itself be utilized and distributed in a heat distribution network. In a further embodiment, the energy recovery is performed electrochemically where chemical energy is converted to electrical energy. The energy recovery process of the embodiments may also be based on a combination of more than one energy recovery methods discussed above.

In the embodiments, there is provided an energy management method, comprising conducting electric energy produced by an energy production plant to an energy storage facility. The method further comprises applying, in the energy storage facility, the received electric energy on a chemical compound to separate the chemical compound to a first component and a second component, wherein the first component comprises an alkaline metal and the second component comprises a halogen gas, storing, in the energy storage facility, the first component and the second component separately, and bringing the first component and second component together to return the original chemical compound and to produce energy when needed. The energy can be utilized in the form of thermic energy or electric energy, for instance. The thermic energy could be distributed to a heat distribution network or to a plant or building to be heated. The electric energy can be conveyed to a power grid and/or to an industrial plant, for instance.

The embodiments disclosed above provide the significant advantage in that the working material or compound is fully recyclable. When the working material has been applied the full operation cycle, that is, been split into components and then combined again into the compound, the original material is again fully usable for storage of energy. Compared to use of fossil fuels, for instance, whose circulation time is calculated in millions of years, the embodiments provide an extremely rapid and environmentally sustainable use of resources. The environmental advantages of the shown embodiments are evident also due to the fact that the solution is not based on burning process producing carbon dioxide, for instance. The shown embodiments illustrate a system, which is scalable, and e.g. between 10 kW to 2 MW, and where the rate of energy production is easily adjustable by adjusting the rate of feeding of the reaction components.

It is evident that when the technology develops, the invention can be implemented in other ways. The invention and the embodiments are thus not limited to the preceding embodiments but can vary in the scope of the attached claims.

The invention claimed is:

1. An energy management method, comprising:
conducting electric energy produced by an energy production plant to an energy storage facility;
applying, in the energy storage facility, the received electric energy to a chemical compound to separate the chemical compound into a first component and a second component, wherein the first component comprises an alkaline metal and the second component comprises a halogen gas;
storing, in the energy storage facility, the first component and the second component separately; and
conducting the first component and the second component through first and second ducts, respectively, into a reaction area of an interior space of a spherical reaction chamber to combine the first and second components to re-form the chemical compound and thereby produce energy when needed, wherein the interior space is sealed to be void of substances other than the first and second components and the chemical compound formed by them and is defined by a surface surrounded by a sheath having an enclosed heat exchanging space, wherein the reaction area is located toward a center of the interior space of the reaction chamber to facilitate even distribution of heat generated by the re-forming of the chemical compound to the heat exchanging space, and wherein the first and second ducts are positioned at a right angle to each other in the interior space of the reaction chamber;

conducting the re-formed chemical compound out of the interior space of the reaction chamber through a third duct, the third duct being located below the first and second ducts; and passing a fluid through the heat exchanging space of the sheath to conduct heat produced in the interior space to the exterior of the reaction chamber.

2. The energy management method according to claim 1 further comprising:

detecting an over production situation in a power grid where all the energy available is not consumed by consumers connected to the power grid; and initiating the conducting of electric energy from the energy production plant to the energy storage facility upon detection of an over production situation in the power grid.

3. The energy management method according to claim 1, wherein the chemical compound comprises sodium chloride, and the first component comprises sodium and the second component comprises chlorine.

4. The energy management method according to claim 1, further comprising:

recovering energy electrochemically and/or thermoelectrically.

5. The energy management method according to claim 1, wherein the sheath comprises a fluid inlet for receiving cooled fluid to the heat exchanging space, and a fluid outlet for allowing the heated fluid to exit the heat exchanging space.

6. The energy management method according to claim 5, wherein the fluid outlet is arranged vertically higher than the fluid inlet.

7. The energy management method according to claim 1, wherein the heat exchanging space sheath comprises protrusions or recesses on the surface of the heat exchanging space sheath to cause turbulence to the fluid being circulated in the heat exchanging space.

8. The energy management method according to claim 1, wherein the reaction chamber further comprises an insulation layer disposed around the sheath.

9. The energy management method according to claim 1, wherein the energy production plant comprises one or more of a wind farm, solar farm, hydro energy plant or nuclear power plant.

10. An energy management arrangement, comprising:

an energy storage facility for storing energy; and a power network connected to the energy storage facility to supply the energy storage facility with electric energy from an energy production plant;

wherein the energy storage facility comprises:

a chamber in which the received electric energy is applied to a chemical compound to separate the chemical compound into a first component and a second component, wherein the first component comprises an alkaline metal and the second component comprises a halogen gas;

storage in which the first component and the second component are separately stored;

first and second ducts through which the first and second components are conducted, respectively, from the storage; and a spherical reaction chamber having an interior space with a reaction area into which the first and second ducts extend to convey the first component and the second component to the reaction area where they are brought together to re-form the chemical compound and to thereby produce energy when needed, wherein the interior space is sealed to be void of substances other than the first and second components and the chemical compound formed by them and is defined by a surface surrounded by a sheath having an enclosed heat exchanging space, through which a fluid may flow to conduct heat produced in the interior space to the exterior of the reaction chamber;

a third duct opening into the interior space of the reaction chamber and through which the re-formed chemical compound exits the interior space, the third duct being located below the first and second ducts;

wherein the reaction area is located toward a center of the interior space of the reaction chamber to facilitate even distribution of heat generated by the re-forming of the chemical compound to the heat exchanging space; and wherein the first and second ducts are positioned at a right angle to each other in the interior space of the reaction chamber.

11. The energy management arrangement according to claim 10, wherein the energy storage facility comprises sodium chloride as the chemical compound, and the first component is sodium and the second component is chlorine.

12. The energy management arrangement according to claim 11, wherein the energy storage facility comprises:

apparatus that includes the reaction chamber in which the first component and the second component are brought together to produce thermal energy; and a thermoelectric generator that converts the thermal energy to electric energy to be released to the power grid.

13. The energy management arrangement according to claim 10, wherein the sheath comprises a fluid inlet for receiving cooled fluid to the heat exchanging space, and a fluid outlet for allowing the heated fluid to exit the heat exchanging space.

14. The energy management arrangement according to claim 13, wherein the fluid outlet is arranged vertically higher than the fluid inlet.

15. The energy management arrangement according to claim 10, wherein the sheath comprises protrusions or recesses on an inner surface of the sheath to cause turbulence to the fluid being circulated in the heat exchanging space.

16. The energy management arrangement according to claim 10, wherein the reaction chamber further comprises an insulation layer disposed around the sheath.

* * * * *